United States Patent
MacNaughton et al.

[11] Patent Number: 5,334,815
[45] Date of Patent: Aug. 2, 1994

[54] APPARATUS AND METHOD FOR PRODUCING A PRINTING SCREEN

[75] Inventors: George MacNaughton, Andover; Steven Forti, Norwell; Douglas Whittington, Malden, all of Mass.; Kevin Ackley, New Boston, N.H.

[73] Assignee: Wear Guard Corp., Norwell, Mass.

[21] Appl. No.: 822,363

[22] Filed: Jan. 15, 1992

[51] Int. Cl.$^5$ ............................................. B23K 26/00
[52] U.S. Cl. ................................................. 219/121.7
[58] Field of Search ........... 219/121.7, 121.74, 121.75; 156/345

[56] References Cited
U.S. PATENT DOCUMENTS

| | | | |
|---|---|---|---|
| 4,857,698 | 8/1989 | Perun | 219/121.71 |
| 4,944,826 | 7/1990 | Zollman et al. | 156/345 |
| 5,063,280 | 11/1991 | Inagawa et al. | 219/121.7 |
| 5,093,549 | 3/1992 | Iwai et al. | 219/121.67 |

Primary Examiner—C. L. Albritton
Attorney, Agent, or Firm—Lieberman & Nowak

[57] ABSTRACT

An apparatus for inking or printing on the surface of an item, such as a badge or emblem, is described. The apparatus incorporates a number of sub-systems including: an apparatus for holding and positioning blank screen material; a laser ablation system for producing the desired hole pattern in the blank screen material to form screens; a print/ink station; a table assembly for supporting a plurality of labels or emblems and moving such labels or emblems sequentially to the print station; and an apparatus for moving the screens to the print/ink station. The apparatus also includes heater for drying the ink after the printing/inking step is completed. The apparatus for producing the patterns includes a laser, mirrors for moving the beam in the x and y directions, and optics for focusing the beam on the blank screen material. The inking station includes an ink tray, a reciprocating squeegee and blades for wiping ink from the leading edges of the squeegee after the squeegee passes over the pattern.

29 Claims, 3 Drawing Sheets

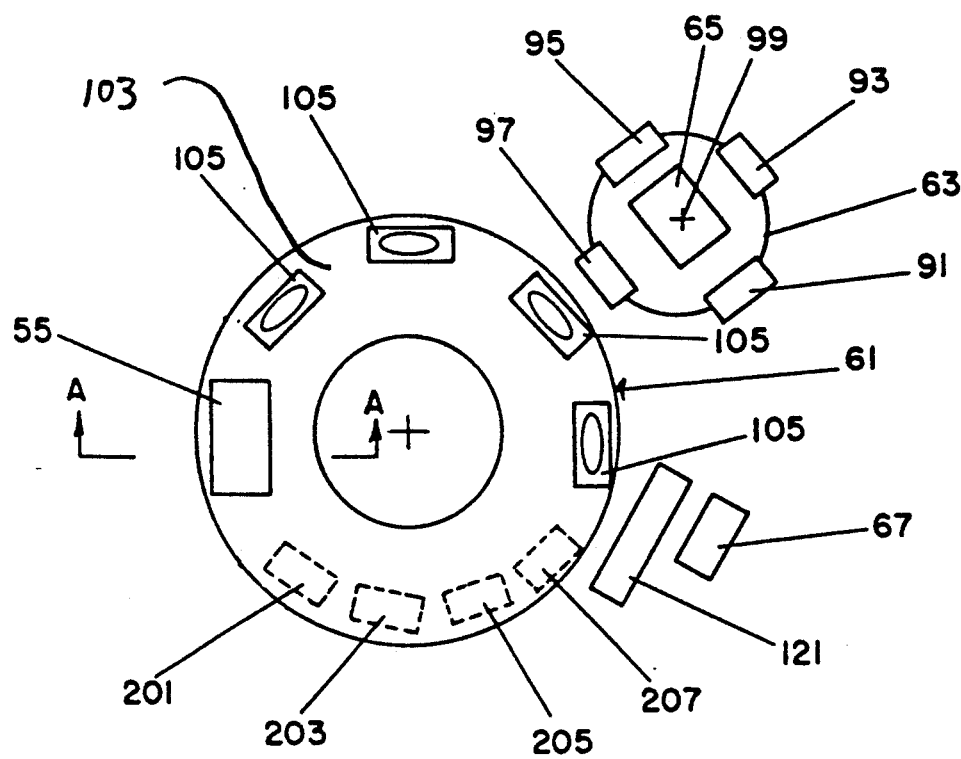
FIG — 2
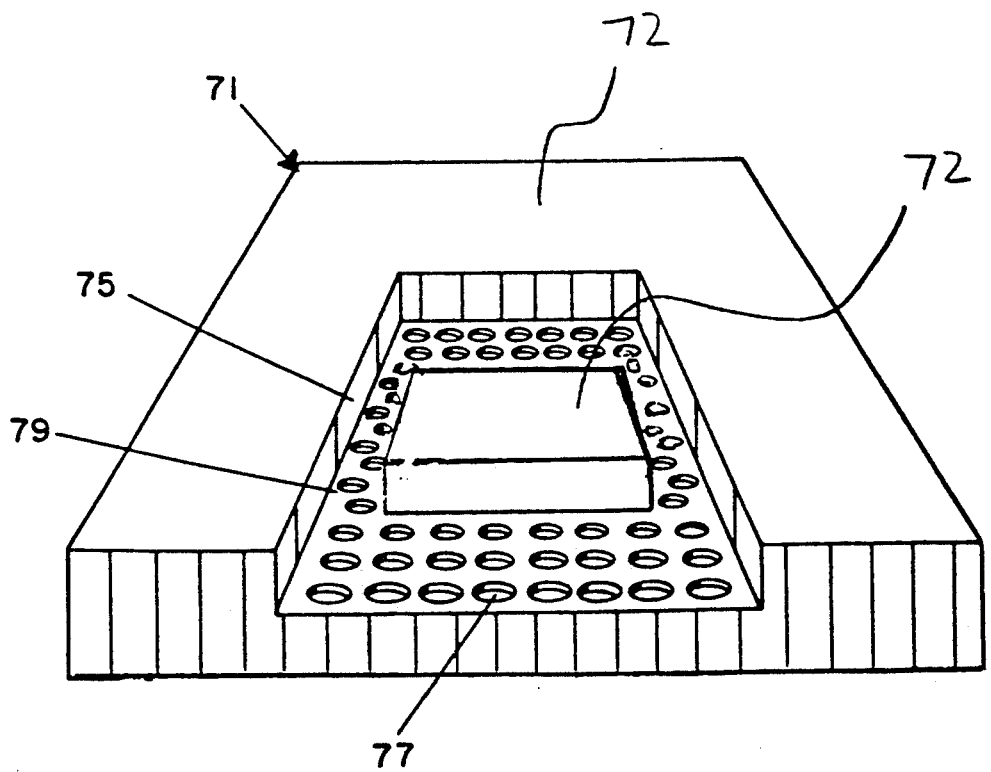
FIG — 3

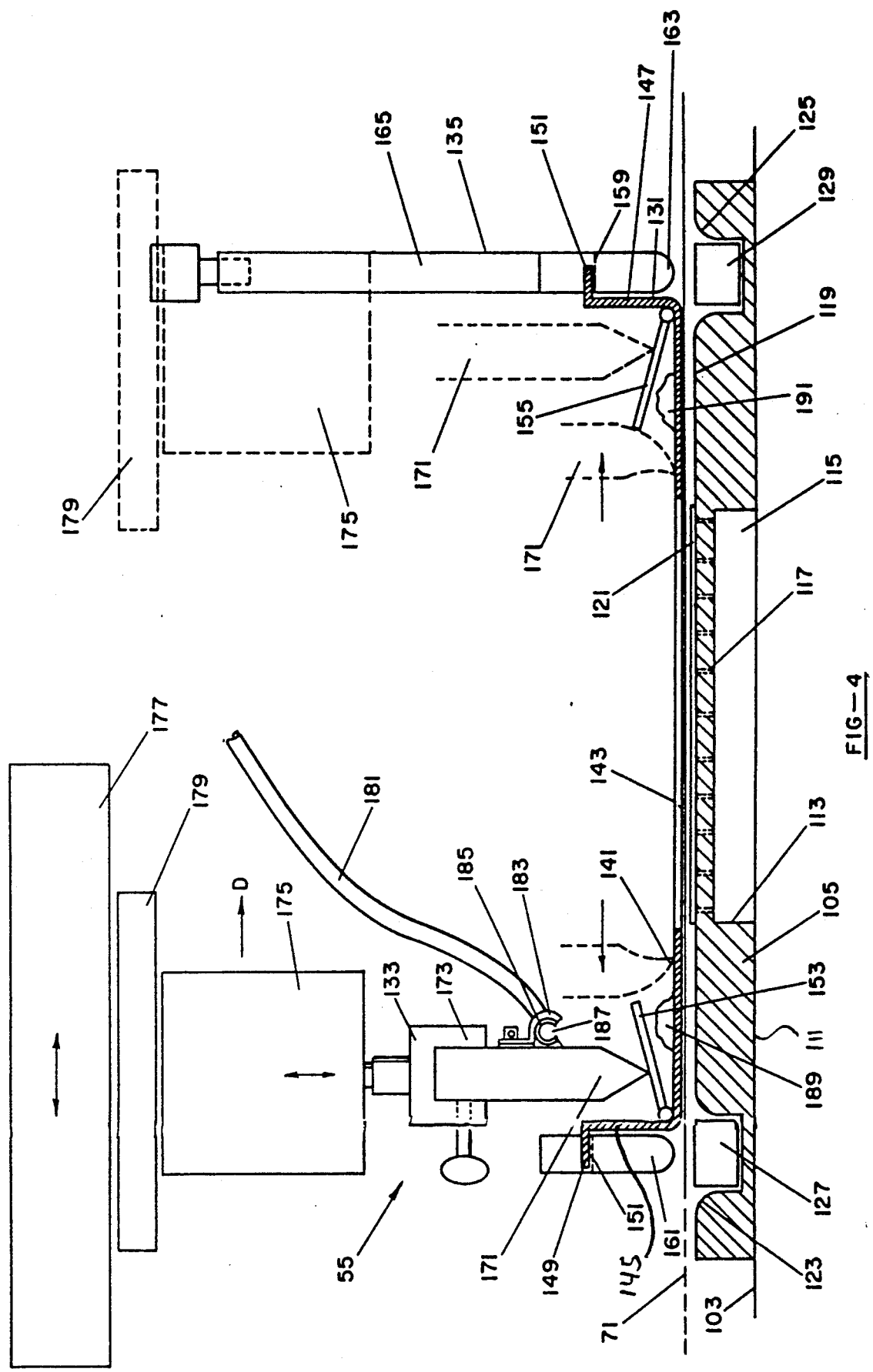

APPARATUS AND METHOD FOR PRODUCING A PRINTING SCREEN

BACKGROUND OF THE INVENTION

It is well-known in the screen printing processes to print through screens of metal or fabric, where the mesh is created by perpendicular filaments. Such screens may be made from a number of materials including, but not limited to, phosphor bronze, copper, molybdenum, gold, platinum or stainless steel. Also, and more commonly, screens are made of synthetic material such as nylon and Dacron. Mesh sizes of 80 to 400 (wires and/or filaments per inch) may be used.

Typically, to form the printing stencil from such screens, the entire screen is filled with a filler, such as gelatin. After filling, excess filler is removed from the printing areas, without removing filler intended to plug the non-printing mesh areas in the screen.

U.S. Pat. No. 3,696,742 to L. P. Parts et al. discloses what is described as an improved screen-printing stencil in which the non-printing areas of a conventional screen are closed with a solid polymer capable of undergoing residue-free depolymerization. After all the apertures in the screen are filled, the prospective printing areas are irradiated with a laser beam of sufficient intensity to depolymerize the polymer from these printing areas and completely evaporate the depolymerization products. The evaporation of the depolymerization products leaves selected areas of the screen mesh open for the passage of ink. In at least some applications the laser beam can be shaped by using a stencil into which the desired pattern or patterns have been cut. Alternately, irradiation can be through a mask laid upon the filled screen.

Japanese application No. 60-230338 to Sanyo also discloses the use of a laser beam to cut a design in a stencil or template material, which stencil is then adhered to a mesh screen, to eliminate the need for photosensitive emulsions. The screen is used for printing thick film integrated circuits.

European Patent No. 0,266,622 to R. Bellot discloses a cylindrical form for screen printing, comprising a cylindrical sieve around which a template is secured. The template can be of plastic and can be secured to the sieve by heat shrinking, heat treatment or adhesive. To determine the printing pattern a laser is used to selectively remove portions of the template.

West German patent application DT 25 39 845 to A. Beckert discloses a printing process which uses a cylindrical perforated carrier screen, with a 40 to 60 line screen distributed homogeneously. The holes in the cylindrical carrier screen can be produced by a laser beam. The screen is then covered with a photo-lacquer layer, or copper, or plastics. Cut outs are formed in this layer having the shape of the letter, etc., to be printed.

Finally, PCT WO 86/04549 to S. Ruckl discloses a screen printing stencil made by perforating a foil uniformly and then coating it so that all the perforations are filled. The foil is then wrapped on a cylinder and a laser beam is then directed on the foil to bare selected perforations in the desired pattern.

All of the above described apparatus and methods require the use of a screen or equivalent (the sieve of Bellot; the perforated cylinder of Beckert; the perforated foil of Ruckl) in which the perforations or openings are filled and then certain perforations/openings selectively opened by a laser beam (Parts and Ruckl) or non-wanted perforations/openings are covered with a stencil (Beckert, Bellot and Sanyo).

U.S. Pat. No. 4,497,848 to A. S. Baran discloses a method and apparatus for producing a machine readable marking, such as a bar code marking, on work pieces. The method includes producing a stencil of the marking in stencil material (such as paper, plastic or metal) by incising the stencil material or by controllably burning the stencil material with a focused laser beam. Coating material is then applied through the stencil.

Although, as is obvious from the above references, there has been a long felt need in the art for a precise "screen" for use in printing, it was not until the subject invention that an inexpensive, accurate method of producing such a screen was feasible.

The subject apparatus and method have a number of advantages over the prior art. The single step of punching or ablating the desired hole pattern(s) in the template stock material with a laser is faster than prior art processes. It avoids the expense and time consuming steps of forming a screen, filling the screen and then removing selected portions of the fill to re-expose portions of the screen. The invention also allows for varying both the pitch of the holes and the size of the holes in a single screen which is not possible with prior art screens. The process also avoids waste removal associated with the prior art. Finally, the apparatus and method of forming the screen facilitates automation of the entire process, from forming the screen to printing and drying. The inking station is automatic, repeatable, and prints on both strokes (forward and backward). As such, the subject invention provides a solution to a long existing problem.

SUMMARY OF THE INVENTION

The subject invention simplifies the above-described processes by eliminating the screen, or its equivalent, and forming the desired hole pattern in a paper, MYLAR (trademarked name for a high strength polyester film), composites, foils or equivalent stock material. The pitch (i.e., number of holes per inch) is varied, either alone or in combination with varying the hole size, and/or shape depending upon the resolution and distribution of a detectable substance required for the particular printing process and/or image to be printed. As used herein, a detectable substance is to include inks, dyes, paints, colorants, etc. Moreover, the subject invention may be adapted for use in the electronic circuit industry and others.

Preferably the hole pattern(s) are created by a laser beam. However, they may also be created by mechanical means (punching with pins, etc.). Also, to eliminate manual printing, the template material is automatically fed, via tractors, through a laser ablation head, where the desired hole pattern(s) are formed, to an automatic ink printing station, dryers and unload station. The template material is in the form of roll or stacked material for continuous laser ablation, printing and drying. The laser and the machinery for handling the template material, applying the ink, etc., are all computer controlled.

BRIEF DESCRIPTION OF THE DRAWINGS

FIG. 2 is a top schematic view of the table used to hold the labels during the printing and drying process;

FIG. 3 is an enlarged perspective view of a section of screen which has been both ablated and partially milled out; and FIG. 4 is a detail of the print station, taken along line A—A of FIG. 2.

DETAILED DESCRIPTION OF THE INVENTION

Figure 1:
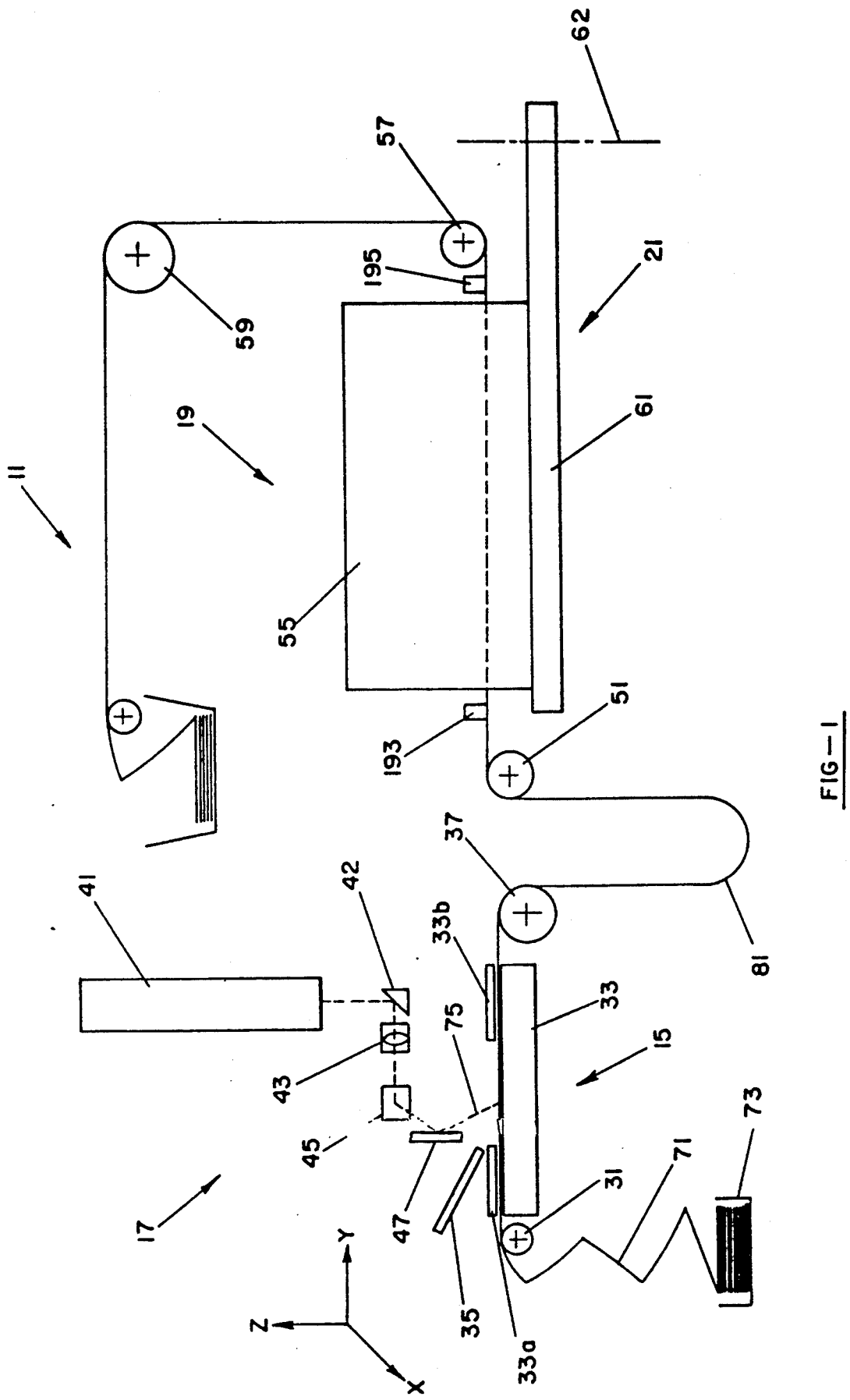
FIG. 1 is a mechanical and optical schematic of the systems for making the screens and printing labels from the screens.

FIGS. 1 and 2 show a preferred embodiment of the subject invention in which the laser ablative printing system 11 includes hold down sub-system 15, laser sub-system 17, print station subsystem 19 and table sub-system 21. Sub-system 15 includes a roller 31, hold down assembly 33, vacuum 35 and template tractor 37. Laser system 17 includes laser 41, right angle mirror 42, computer controlled focusing lens 43, X-axis articulating mirror (or galvanometer) 45, and Y-axis articulating mirror (or galvanometer) 47. Sub-system 19 includes roller 51, print station 55, roller 57 and tractor 59. Finally, table sub-system 21 includes rotatable table 61, label magazine 63, pick and place mechanism 65, and pick and place mechanism 67.

Template or screen material 71, which may be paper, foil, MYLAR stock or the like, is pulled from roll or stacked stock 73 over roller 31 and through hold-down assembly 33 by tractor 37. Assembly 33, which includes cover or hold-down plates 33a and 33b, functions to hold material 71 while selected portions thereof are being ablated by pulses from laser 41, as explained in detail below. Material 71 is mechanically held between the upper surface of assembly 33 and the lower surfaces of plates 33a and 33b. In the holding position these opposing surfaces are spaced from each other approximately 0.010 inches. A negative air pressure system (35) is provided to remove smoke during the ablating process.

In addition to paper or MYLAR stock, other suitable materials including, but not limited to, polyethylene, plastic films, metal foils, non-woven fibers and composite materials (substrates which have been plated by chemical vapor deposition or electroplating) may be used.

While held in position by assembly 33, the desired individual screen is formed in one operation by laser sub-system 17. For each individual screen, only those portions of material 71 requiring ablation are perforated while those portions not requiring ablation are not perforated by the beam 75 from laser 41. Those portions of the screen intended to produce a uniform distribution of ink on the printed emblem will be ablated with a uniform distribution of holes, whose pitch is computer controlled. As an example, a symbol such as a letter or number, requiring a uniform ink distribution, would have a perforated hole pattern of 6 mil (0.006") diameter holes spaced on 10 mil centers (i.e., a pitch of 100 holes per inch). Where a screen requires higher resolution to produce fine ink lines or dots in the graphic image to be printed (such as the fine lines descriptive of boat sails), those portions of the screen used to produce such fine lines will be ablated at a higher pitch, such as 120 holes per inch (6 mil holes on 8.3 mil centers). The size of the holes can also be varied from, approximately, 1 mil in diameter to, approximately, 20 mils or greater. Such variability of hole size allows for "half tones" to be achieved when printing with multiple colors (i.e., multiple screens printed "in register"). Half tone printing enables richer more versatile prints using fewer screens (colors). Smoke and any other debris resulting from the ablation process may be removed by vacuum 35.

The holes are ablated in screen 71 by, for instance, a 50 watt $CO_2$ laser operating at the infrared wavelength of 10,600 nanometers (nm). Laser 41 is computer controlled to deliver one pulse per ablated pixel hole. When filling a uniform field of pixels, such as used for printing a solid letter or number, laser 41 can operate at a pulse repetition frequency (PRF) of 2500 Hz°. At a typical operating pulse width of 100 microseconds, laser 41 delivers 10 millijoule of perforation energy per pulse in a diffraction limited spot of 5 mil diameter, which exceeds the energy requirement for perforating 4 mil thick MYLAR stock or 3.5 mil paper or metal foil. Long term, stable laser perforation quality is derived from a temperature stabilized ($+/-0.10°$ C.) water cooling, by conventional apparatus not shown, of laser 41, together with the vacuum removal of ablated and sublimated material to maintain optical cleanliness. As those skilled in the art will appreciate, many other commercial lasers can be substituted for laser 41. Further, it will also be appreciated that other frequencies, pulse widths and energy outputs are satisfactory. The thickness and type of material 71, as well as the diameter of each perforation, determines the power required to blow holes in such material.

Automatic laser beam steering and laser spot focus over the flat field of the template (i.e., material 71) is achieved by x-axis servo controlled galvanometric mirror 45, y-axis servo controlled galvanometric mirror 47, and computer controlled focusing lens 43. As those skilled in the art will appreciate, galvanometric mirror 45 scans beam 75 in the x-direction. Similarly, conventional galvanometric mirror 47 scans beam 75 in the y-direction. Z-axis focus mechanism 43, which is also conventional, functions to insure that the spot of beam 75 remains in focus, regardless of the x and y position of such spot. Mirrors 45 and 47 and focus mechanism 43 are all controlled in a conventional manner, such as by computer. To increase the size of the standard $4'' \times 4''$ image ablated in material 71 in the y-direction, if necessary, material 71 may be moved in the y-direction, after which the ablating process may continue. Alternately, assembly 33 may be moved in the x and/or y-direction. Finally, it would also be possible to achieve desired focus of the spot by moving material 71 or laser 41 in the Z direction.

In addition to simply blowing holes clear through material 71, laser 41 can be used to mill out a section 75 from the surface 72 of material 71 and then perforate the remaining thickness with screen holes 77 of various diameters, as illustrated in FIG. 3. The substrate milled out would be in the shape of the image to be printed, to create a well in which ink resides. In the subsequent printing operation, ink fills the reservoir 79 created by the milling step and is then printed onto the receiving material. The chief benefit of this technique is that it creates an extremely sharp image, because the routed/milled edges 81 are clean. Were only holes used to define such detail, a sawtooth edge would result.

After a particular screen has been produced by the laser ablative printing system described above, assembly 33 releases stock 71 and tractor 37 is energized to remove the screen off assembly 33 and, in sequence with the previously ablated screens, into service loop 81. Via appropriate computer controls, the individual screens ablated in continuous stock 71 are produced in the order they are to be used for screen printing.

With reference to FIG. 2, label magazine 63 includes, in the preferred embodiment, four magazines 91, 93, 95 and 97 supported via conventional apparatus not shown, in carousel fashion for rotation about axis 99. (Throughout the application, the terms label, badge and emblem are used; however, these terms are merely illustrative of suitable printing surfaces and are not to be considered limitations). As with the other sub-systems, the rotational position of the magazines is computer controlled in the appropriate sequence relative to such other sub-systems. Typically, with four magazines, four different colored emblems are available for printing. In the position illustrated in FIG. 2, magazine 97 is positioned adjacent table 61 of sub-assembly 21, and under the conventional suction cups (not shown) of conventional pick and place unit 65 such as, for example, the UNIPLACE manufactured by PMD Corporation. Suction cups pick up one label at a time and, via conventional arms, move such label to one of the emblem holding stations 105 provided in surface 103 of table 61. Each station 105 includes a vacuum system to hold the individual label in place after it is released by the suction cups of pick and place unit 65.

Again with reference to FIG. 2, table 61 is rotated in a counter-clockwise direction via any suitable rotational device (not shown) to sequentially position the blank emblems under the desired screen, formed in stock 71, for inking. This stepped, sequential motion also correctly positions the next station 105 under the suction cups of pick and place unit 65 and a finished label under the suction cups (not shown) of a second conventional pick and place unit 67. Again, all such motion is appropriately sequenced via appropriate computer controls.

With reference to FIG. 4, each emblem holding station 105 includes a lower surface 111 which is in mating contact with surface 103 (not shown), a recessed area 113 which is connected (via apparatus not shown) to any suitable conventional vacuum system (also not shown) to form a vacuum chamber 115. One or more vacuum holes 117 connect chamber 115 with label support surface 119 to hold a label, such as illustrated at 121, in place for inking. Each station 105 also includes a pair of longitudinal slots 123 and 125 in which are positioned foam pads 127 and 129. Preferably, the upper edges of slots 123 and 125 are rounded.

As illustrated in FIG. 4, print station 55 includes an open sided flexible metal ink tray 131, squeegee assembly 133 and ink tray positioning system 135. Ink tray 131 includes a flat bottom portion 141, having a rectangular opening 143 therein large enough to expose the pattern ablated in material 71, side portions 145 and 147, and lips 149 and 151. Tray 131 also includes a pair of rocker blades 153 and 155 which are spring loaded or otherwise biased (via conventional apparatus not shown) to the positions illustrated in FIG. 4. Lips 149 and 151 are supported by surfaces 157 and 159 of horizontal paper stretchers 161 and 163 which are, in turn, secured at their opposite ends by four vertical rods, such as the one illustrated at 165. These rods are, in turn, part of the framework of print station 55 (not shown) which framework, via suitable conventional hydraulic or pneumatic apparatus (also not shown), moves ink tray 131 and paper stretchers 161 and 163 in an up and down motion, via appropriate computer controls, as required during the inking process. When 161 and 163 are actuated down, they clamp material 71 against pads 127 and 129. As the pads deform, material 71 stretches slightly.

Squeegee system 133 includes a squeegee 171 which is formed of urethane, a u-shaped bracket 173 for holding squeegee 171, and air cylinders 175 and 177. Cylinder 175, which moves squeegee 171 in the vertical direction, is connected to cylinder 177 via plate 179 and suitable fasteners (not shown). Cylinder 177 which is, in turn, secured to the framework of station 55, moves squeegee 171 in the horizontal direction, from the position illustrated in solid lines to the positions illustrated in broken lines on the right side of FIG. 4. System 133 also includes an ink delivery tube 181 which is connected at ink delivery end 185 to squeegee 171 via clamp 183 and at the other end to a pressurized ink reservoir (not shown) also, preferably supported on the frame of station 55. End 185 has, preferably, a series of small holes such as illustrated at 187 which deliver ink along the length of squeegee 171.

In operation, with an emblem 121 held in position on surface 119 of station 105, and the various components of station 55 in the position illustrated in FIG. 4, a predetermined amount of ink is forced through holes 187 onto the leading edge of squeegee 171. Air cylinder 175 is then actuated, and blade 153 hinges down and forces ink (collected at 189) out to the right. Air cylinder 177 then moves squeegee 171 in a left-to-right direction, as indicated by arrow D. The ink that has been forced out from below blade 153, together with the ink forced through holes 187, is then wiped across material 71 and forced through the ablated pattern and onto the emblem 121. As is also illustrated in FIG. 4, just before squeegee 171 completes a pass the leading edge is wiped by blade 155, as illustrated by the dotted lines. The ink wiped off collects as indicated at 191. On the return stroke, from right to left, the ink that was just wiped off the leading edge of squeegee 171 is now on the opposite leading edge, which is then wiped over the hole pattern ablated in material 71. Depending on, for instance, the hole pattern ablated and the type and color of ink one or more passes are needed to properly ink emblem 121. The tension of the squeegee 171 against the material 71 can be varied to regulate the flow and amount of ink passing through the ablated pattern. With reference to FIG. 1, bars 193 and 195 rest on material 71 to hold it in tension over surface 119 and to make sure it doesn't stick to the underside of ink tray 131.

After the inking of a particular emblem is completed tray 131 is lifted up by raising system 135 (including bars 161 and 163 and rod 165) and material 71 is drawn through by tractor 59 to position a new template in print station 55. The computer controlled electronics (and/or pneumatics and mechanical means) also incrementally, rotate table 61 about axis 62 (see FIG. 1) to position a new emblem under ink tray 131 (see FIG. 4), after which the inking process is repeated. If ink color is to be changed tray 131 is lifted out of system 135 and replaced with a clean tray.

After the inking step is completed, the rotation of table 61 places the just inked emblem under the first of, preferably, four heaters 201, 203, 205, 207, positioned above surface 103 of table 61, as schematically illustrated in FIG. 2. Each heater is an infrared heater timed to flash for, for instance, 3 seconds when an emblem is positioned beneath it. With four such heaters each emblem is subjected to a total cure time of 12 seconds.

After the curing process is completed, each emblem is removed from table 61 by the second conventional pick and place mechanism illustrated schematically at 67 in FIG. 2. The mechanism includes suction cups (not shown) which, in conjunction with a jet of air forced up through the suction holes provided in each station 105, lifts each finished emblem from table 61 and places it on a conveyor to be inspected and removed.

The above described processes of feeding stock 71 to hold-down system 17, custom ablating each individual screen by laser system 17, feeding the finished screens sequentially to print station system 19, loading blank labels on table system 21 and coordinating the blank labels with the required screen, forcing ink through the screen to ink the labels, curing the inked labels and removing them from the table, and either re-using a screen or advancing a new screen into position on print station 55 may all be accomplished with one computer.

Whereas the drawings and accompanying description have shown and described the preferred embodiment of the present invention, it will be apparent to those skilled in the art that various changes may be made in the form of the invention without affecting the scope thereof. For instance, table 61 could be replaced by an in line linear conveyor. Accordingly, the subject invention is only to be limited by the claims that follow and their equivalents.

What is claimed is:

1. An apparatus for producing a printing screen from a non-perforated template material, comprising:
   means for positioning the template material relative to a laser;
   a laser for ablating the template material to form holes;
   means for moving the beam from the laser in the x-direction relative to the template material;
   means for moving the beam in the y-direction relative to the template material;
   means for focusing the beam on the template material; and
   powered means for feeding the template material in the form of a web to said positioning means, and for feeding the template material away from the positioning means in the form of a screen web after the laser beam has formed holes therein.

2. An apparatus of claim 1 further comprising means for varying the spot size of the beam to vary the size of the holes produced.

3. An apparatus of claim 1 further comprising means for moving the template material away from the positioning means, after the template material has been ablated by the laser to form a pattern of holes.

4. An apparatus for producing a printing screen from a non-perforated template material, comprising:
   means for positioning the template material relative to a laser, comprising a roller, a hold down assembly, and a template tractor;
   a laser for ablating the template material to form holes;
   means for moving the beam from the laser in the x-direction to the template material;
   means for moving the beam in the y-direction to the template material; and
   means for focusing the beam on the template material.

5. An apparatus of claim 4 further comprising a vacuum for holding the template material in position.

6. An apparatus of claim 1, wherein the laser is a $CO_2$ laser.

7. An apparatus of claim 1, wherein means for moving the beam from the laser in the x-direction relative to the template material comprise an articulating mirror.

8. An apparatus of claim 1, wherein means for moving the beam from the laser in the x-direction relative to the template material are performed by moving the template.

9. An apparatus of claim 1, wherein means for moving the beam from the laser in the y-direction relative to the template material comprise an articulating mirror.

10. An apparatus of claim 1, wherein means for moving the beam from the laser in the y-direction relative to the template material are performed by moving the template.

11. An apparatus for producing a printing screen from a non-perforated template material, comprising:
    means for positioning the template material relative to a laser;
    a laser for ablating the template material to form holes;
    means for moving the beam from the laser in the x-direction relative to the template material;
    means for moving the beam in the y-direction relative to the template material;
    means for focusing the beam on the template material; and
    powered means for moving the template material away from the positioning means, after the template material has been ablated by the laser to form a pattern of holes.

12. Apparatus as recited in claim 11 further comprising hold down means for holding the template material in place while the beam of said laser is focused thereon, and for releasing the material when said powered means is activated for moving the template material away from said positioning means.

13. Apparatus as recited in claim 1 wherein said powered means for feeding the template material to said positioning means comprises a surface over which the web of template material travels, and rollers on opposite sides of said surface for guiding and feeding the web with respect to said surface.

14. Apparatus as recited in claim 13 further comprising hold-down plates disposed above said surface, and for positively holding the web material in a predetermined position on said surface during formation of holes in the template material web by said laser.

15. Apparatus as recited in claim 1 further comprising a print station sub-system for receipt of said screen web from said powered means, and for printing a substrate.

16. Apparatus as recited in claim 1 further comprising a print station sub-system for receipt of said screen web from said powered means, and for printing a substrate.

17. Apparatus as recited in claim 16 wherein said print station sub-system comprises: means for supporting a substrate to be printed; means for positioning said screen web so that the hole pattern in said screen is in close proximity with the substrate; an ink tray having a bottom with an opening thereon of a size greater than the pattern to be printed on the substrate with said screen; means for positioning said ink tray above both said screen and the substrate; squeegee means having first and second leading edges for pushing ink through the hole pattern in said screen; and means for moving said squeegee means in a horizontal direction stroke so as to move ink through the hole pattern in said screen onto the substrate to be printed.

18. Apparatus as recited in claim 17 wherein said tray includes a first blade means for wiping ink from said first leading edge of said squeegee means before said squeegee means reaches the end of its stroke.

19. Apparatus as recited in claim 18 wherein said first blade means comprises wiping means biased in an upward direction away from said tray bottom for wiping said first leading edge, movement of said squeegee means across said wiping means moving said wiping means toward said tray bottom.

20. Apparatus as recited in claim 19 further comprising second blade means, with wiping means, for wiping said second leading edge of said squeegee means, said first and second blade means being positioned adjacent opposite edges of ink tray opening.

21. Apparatus as recited in claim 17 wherein said means for moving said squeegee means moves said squeegee means in back and forth strokes in a horizontal direction.

22. Apparatus as recited in claim 17 further comprising means for moving said screen in a vertical direction, toward and away from said screen, movement away from said screen permitting said screen to be moved in a horizontal direction relative to said tray and said substrate supporting means.

23. Apparatus as recited in claim 17 further comprising means for moving said squeegee means in a vertical direction, toward and away from said tray.

24. Apparatus as recited in claim 17 further comprising vacuum means for holding the substrate on said supporting means.

25. Apparatus as recited in claim 17 further comprising powered means for moving said screen web away from said print station sub-system to a collection station after printing of one or more substrates using said screen web.

26. Apparatus as recited in claim 16 further comprising powered means for moving said screen web away from said print station sub-system to a collection station after printing of one or more substrates using said screen web.

27. Apparatus as recited in claim 17 further comprising means for applying variable pressure with said squeegee means.

28. Apparatus as recited in claim 16 further comprising means defining a loop of said screen web between said positioning means and said print sub-system.

29. Apparatus as recited in claim 1 further comprising means defining a loop of said screen web downstream of said laser.

* * * * *